US006968518B2

(12) United States Patent
Hegde et al.

(10) Patent No.: US 6,968,518 B2
(45) Date of Patent: Nov. 22, 2005

(54) METHOD OF RESOLVING MISSING GRAPHICAL SYMBOLS IN COMPUTER-AIDED INTEGRATED CIRCUIT DESIGN

(75) Inventors: Shailesh U. Hegde, Cary, NC (US); Melvin T. Isom, III, Durham, NC (US)

(73) Assignee: Infineon Technologies AG, Munich (DE)

( * ) Notice: Subject to any disclaimer, the term of this patent is extended or adjusted under 35 U.S.C. 154(b) by 209 days.

(21) Appl. No.: 10/348,928

(22) Filed: Jan. 21, 2003

(65) Prior Publication Data

US 2004/0143799 A1 Jul. 22, 2004

(51) Int. Cl.[7] .............................................. G06F 17/50
(52) U.S. Cl. .............................................. 716/3; 716/2
(58) Field of Search ............................... 716/8–10, 18, 716/2–3

(56) References Cited

U.S. PATENT DOCUMENTS

| | | | | |
|---|---|---|---|---|
| 6,370,677 | B1 * | 4/2002 | Carruthers et al. | 716/8 |
| 6,553,553 | B2 * | 4/2003 | Komaki | 716/10 |
| 6,701,289 | B1 * | 3/2004 | Garnett et al. | 703/14 |
| 6,738,957 | B2 * | 5/2004 | Gont et al. | 716/11 |

OTHER PUBLICATIONS

"*Introduction to Skill and Skill Programming—Training Manual Version 4.4.1*," Cadence Design Systems, Inc., Apr. 11, 1997, pp. i-xviii, 1-2-17-26, A-1-C-13.
"*Introduction to Skill and Skill Programming—Lab Book Version 4.4.1*, " Cadence Design Systems, Inc., Apr. 11, 1997, pp. i-xiii, 1-1-17-15, A-1-A-10.
"*Virtuoso Schematic Composer*," Cadence Design Systems, Inc. Datasheet (2003).
Levi et al., "*Down to the Wire—Requirements for Nanometer Design Implementation*," Cadence Design Systems, Inc. White Paper (2002).
"*Physical Design Retargeting*," Sagantec North America, Inc. [online] [retrieved on Apr. 3, 2003], retrieved from the Internet <URL: www.sagantec.com/html/physical.html>.
"*Libraries & Silicon Infrastructure*," Sagantec North America, Inc. [online] [retrieved on Apr. 3, 2003], retrieved from the Internet <URL: www.sagantec.com/html/library.html>.
"*SiClone—Accelerate Physical Implementation and Closure for Full Custom Design*," Sagantec North American, Inc. Datasheet (2000).
"*Hurricane—Re-Use and Optimize Your Existing, Silicon-Proven Intellectual Property*," Sagantec North America, Inc. Datasheet (2000).
"*Companion—Accelerate Your Full Custom Layout Design by 2X-10X!*, " Sagantec North America, Inc. Datasheet (2000).
"*Perl 5.6 Documentation*," [online] [retrieved on Apr. 4, 2003], retrieved from the Internet <URL: www.perldoc.com/perl5.6/pod/perl.html>.
"*Programming Languages-C++, Languages de programmation =C++*," America National Standard Institute, International Standard, ISO/IEC 14882, Jul. 27, 1998, pp. i-xxvi, 1-749.

* cited by examiner

*Primary Examiner*—Stacy A. Whitmore
(74) *Attorney, Agent, or Firm*—Brinks Hofer Gilson & Lione

(57) ABSTRACT

A system and method is presented for resolving missing graphical symbols in computer-aided design of integrated circuits during schematic migration. The system inserts a substitute target graphical symbol for the missing graphical symbol, or creates and inserts a dummy target symbol, such as a resistor network that maintains the electrical continuity of the target schematic.

19 Claims, 10 Drawing Sheets

| | | | | |
|---|---|---|---|---|
| maximum_voltage | 7.5 | 35 | 6.5 | 32 |
| length | 280 | 340 | 170 | 380 |
| width | 180 | 180 | 140 | 200 |
| drain_area | 50 | --- | 20 | 90 |
| source_area | 20 | --- | 10 | 40 |
| bulk_capacitance | 3.5 | --- | 2.5 | --- |

METHOD OF RESOLVING MISSING GRAPHICAL SYMBOLS IN COMPUTER-AIDED INTEGRATED CIRCUIT DESIGN

FIELD OF THE INVENTION

This invention relates to integrated circuit design. More particularly, the invention relates to a method of resolving missing graphical symbols in computer-aided integrated circuit design.

BACKGROUND

Many integrated circuits are designed using computer-aided design ("CAD") programs running on a workstation. The designer typically selects electronic components for the integrated circuit through a graphical user interface ("GUI"), which includes a graphical display screen and a computer mouse or similar pointing device, familiar to those of ordinary skill in the art.

The electronic components are represented graphically by the CAD program on the graphical display screen. To position the electronic component within the part of the integrated circuit's schematic that is displayed on the screen, the designer "drags" the graphical symbol for the component to a position on the screen using the mouse. The designer "drops" the graphical symbol for the electronic component at the desired position on the screen and connects the graphical representation of the terminals of the electronic component to the terminals of other electronic components displayed on the screen. Connecting the graphical representation of the terminals in the GUI represents forming an electrical connection between the components on the designed integrated circuit.

Upon completing or editing the schematic for the part of the integrated circuit that is being designed, the designer may save the schematic as a circuit block. The circuit block consolidates the components in the schematic into a single entity for use within the CAD program. The designer assigns alphanumeric strings to the inputs and outputs of the circuit block for identifying the inputs/outputs, and also assigns an alphanumeric string to the circuit block as a name that identifies the circuit block. The circuit block may be added to a library of circuit blocks, catalogued by the assigned alphanumeric names, and represented as a circuit block on the GUI. Thereafter, the designer may connect the circuit blocks using the GUI in the same manner as with individual components by interconnecting the inputs and outputs of the circuit blocks.

Circuit blocks may be combined to form higher level circuit blocks resulting in a hierarchy of circuit blocks available to the designer. For example, an arithmetic processor circuit block may comprise at least one binary adder circuit block. The binary adder circuit block in turn may comprise multiple XOR logic gate components. The XOR logic gate components may comprise multiple NAND logic gate components, which in turn comprise multiple Complementary Metal Oxide Semiconductor ("CMOS") transistors. The designer typically stores the hierarchy of circuit blocks in a schematic database.

The CAD program may also create a graphical representation of the masks that are used in projection lithography to lay out the transistors and interconnections of the circuit blocks on a substrate for the integrated circuit. Alternatively the CAD program may control an electron-beam lithographic device to directly draw the masks on the integrated circuit substrate. The masks sequentially form layers of the semiconductor structures of the individual transistors on the substrate.

As manufacturing technology develops, a circuit designed originally in older technology may be reused as a circuit in the newer technology. Importing the schematic from one database to another saves designing the schematic from scratch in the new technology. For example, when designing an arithmetic processor for an integrated circuit that is to be built according to 140 nm CMOS technology, the designer may reuse the schematic for the processor from the schematic database for 170 nm CMOS technology. (The 140 nm and 170 nm refer to the minimum feature size on the respective technologies.) The schematic databases for 140 nm and 170 nm technology may differ in several ways, not the least of which is that the graphical representations of the masks for 140 nm technology typically include smaller semiconductor structures than the respective structures in 170 nm technology.

Moreover, some integrated circuits may include CMOS structures according to both technologies. For example, an integrated circuit may use 140 nm CMOS transistors in most circuit blocks, but use 170 nm CMOS transistors for components that are required to operate at a higher voltage than the 140 nm transistors. The schematics for such circuit blocks require distinguishable graphical symbols for the components of each structure size in order to clearly identify the 140 nm components and the 170 nm components. Therefore each structure size may have distinguishable graphical symbols and parameters associated with the symbols, such as the transistor gate thickness or the maximum drain-to-source voltage.

Transferring a design for an electronic circuit block from the schematic databases for one technology to the schematic database for another technology may lead to mismatches between the symbols and/or parameters. Additionally, different teams that are jointly developing the same design may use different schematic databases, leading to further mismatches when transferring designs between the schematic databases. The process of transferring designs between different schematic databases is termed "schematic migration" by those of ordinary skill in the art. Moreover, a schematic database may not contain a graphical symbol for a particular component, which hinders the effective transfer of a design to this schematic database if the design includes the particular component. Therefore there is a need for a method for resolving missing graphical symbols in CAD programs during schematic migration.

SUMMARY

A method and system are described below to address the need for a system and method for resolving missing graphical symbols in a computer-aided integrated circuit design system.

In accordance with one aspect of the invention, a method of resolving missing graphical symbols in a computer-aided integrated circuit design system is presented. The method includes reading a source circuit primitive from a source schematic database and determining whether the source circuit primitive corresponds to a target circuit primitive in a target schematic database. The method also includes associating the source circuit primitive with a replacement target circuit primitive if the source circuit primitive does not correspond to the target circuit primitive.

Another aspect of the invention is a system for resolving missing graphical symbols in a computer-aided integrated circuit design system. The system includes means for reading a source circuit primitive from a source schematic database and means for determining whether the source circuit primitive corresponds to a target circuit primitive in a target schematic database. The system also includes means for associating the source circuit primitive with a replacement target circuit primitive if the source circuit primitive does not correspond to the target circuit primitive.

The foregoing and other features and advantages of preferred embodiments will be more readily apparent from the following detailed description, which proceeds with reference to the accompanying drawings.

DETAILED DESCRIPTION OF THE PRESENTLY PREFERRED EMBODIMENTS

Integrated circuits, due to their complexity, are typically designed using CAD tools, which are computer programs that allow the designer to build the schematic layout for the internal circuitry of the integrated circuit, simulate the electronic behavior of sections of the circuitry, and create photolithographic masks for constructing the circuits on the substrate of the integrated circuit. Examples of CAD tools include the Cadence tools manufactured by Cadence Design Systems, Inc. of San Jose, Calif., and those based on programming languages including the C++ programming language and the Practical Extraction and Reporting Language ("Perl"). Information on C++ may be found in the American National Standards Institute ("ANSI") standard ISO/IEC 14882, titled "Programming languages—C++," dated 1998, and information on Perl may be found at the Perl webpage. Perl home page [online]. O'Reilly, 1999 [retrieved on 2002-09-20]. Retrieved from the Internet: <URL: http://www.perl.com>

Figure 1:
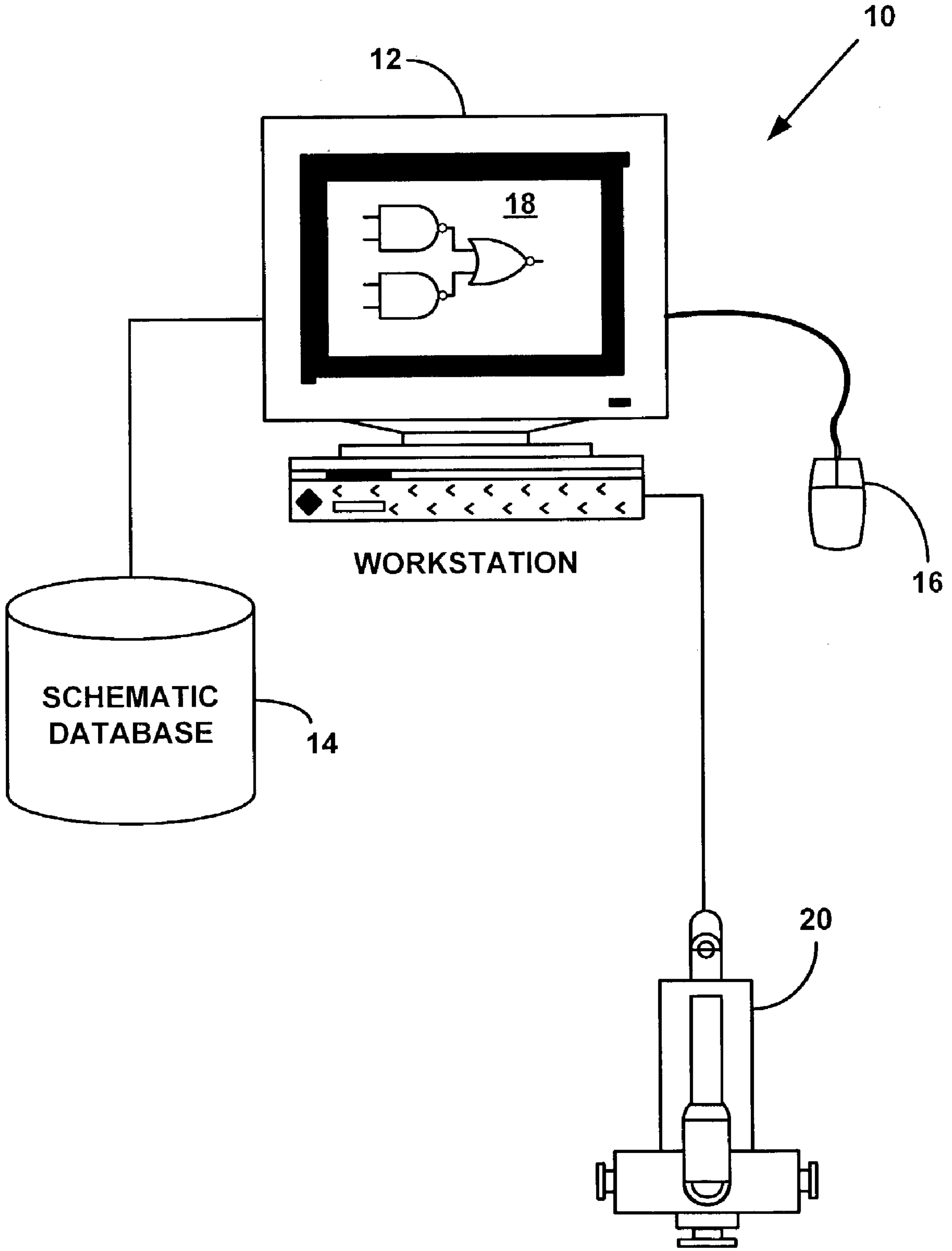
FIG. 1 is a block diagram illustrating a preferred configuration of a computer-aided integrated circuit design system.

FIG. 1 is a block diagram illustrating a preferred configuration of a computer-aided integrated circuit design system 10. The designer typically selects electronic components for the integrated circuit using a GUI running on a workstation 12. For example, the system 10 may include a computer workstation 12 manufactured by Silicon Graphics, Incorporated of Mountain View, Calif. A schematic database 14 is in communication with the workstation 12 and stores information on the graphical symbols for the electronic components of the design. In one embodiment, the GUI includes a graphical display screen 18 and a computer mouse 16, familiar to those of ordinary skill in the art. The workstation 12 is in communication with the mouse 16 or other graphical input device and interacts with the mouse 16 and display screen through a GUI program running on the workstation 12.

The designer uses the mouse 16 to select an electronic component from the schematic database 14. The designer drags and drops the graphical symbol for the electronic components at a desired position within a schematic that is displayed on a display screen 18 of the workstation 12. The designer connects the terminals of the selected electronic component to terminals of other components in the schematic with the mouse 16 by drawing lines between the graphical symbols displayed by the GUI on the workstation's 12 display screen 18.

The designer may also instruct the CAD system 10 to create a graphical representation of the masks that are used to layout the transistors and interconnections of the electronic circuit blocks on a substrate for the integrated circuit. The CAD system 10 retrieves a representation of the geometric structure of each semiconductor device corresponding to an electronic component from the schematic database and lays out the geometrical structures that correspond to the schematic on the integrated circuit's substrate. Further processing by the CAD system 10 and the workstation 12 produces the graphical representations of the masks that are used to sequentially build the geometric structures using the photolithographic processes that make the integrated circuit. The graphical representations of the masks may be displayed on the workstation 12 or output to a lithographic device 20 that either, as is familiar to those of ordinary skill in the art, draws the mask on a glass plate as in optical lithography, or draws the mask directly on the integrated circuit substrate as in electron-beam lithography.

An operating environment for the CAD system 10 includes a processing system with at least one Central Processing Unit ("CPU") and a memory system. Preferably, the at least one CPU controls the operations of the workstation 12. In accordance with the practices of persons skilled in the art of computer programming, the preferred methods are described herein with reference to acts and symbolic representations of operations that are performed by the processing system, unless indicated otherwise.

It will be appreciated that the acts and symbolically represented operations include the manipulation of electrical signals by the CPU. The electrical signals represent data bits that cause a resulting transformation or reduction of the electrical signal representation. The workstation 12 and other devices of the CAD system 10 may maintain data bits at memory locations in their respective memory systems to reconfigure or otherwise alter their CPU's operation, as well as other processing of signals, or maintain data bits on the schematic database 14. The memory locations, such as random access memory ("RAM") or the medium of the schematic database 14, are physical locations that have particular electrical, magnetic, or optical properties corresponding to the data bits, depending on the type of memory used. For example, the medium of the schematic database 14 may be a magnetic hard disc and/or a compact disc read only memory ("CD-ROM") having written thereon data structures and/or data files as is familiar to those of skill in the art.

The data bits may also be maintained on a computer readable medium including magnetic disks, optical disks, and any other volatile or non-volatile mass storage system readable by the CPU. The computer readable medium includes cooperating or interconnected computer readable media that exist exclusively on the CAD system 10 or are distributed among multiple interconnected processing systems that may be local to or remote to the CAD system 10.

Figure 2:
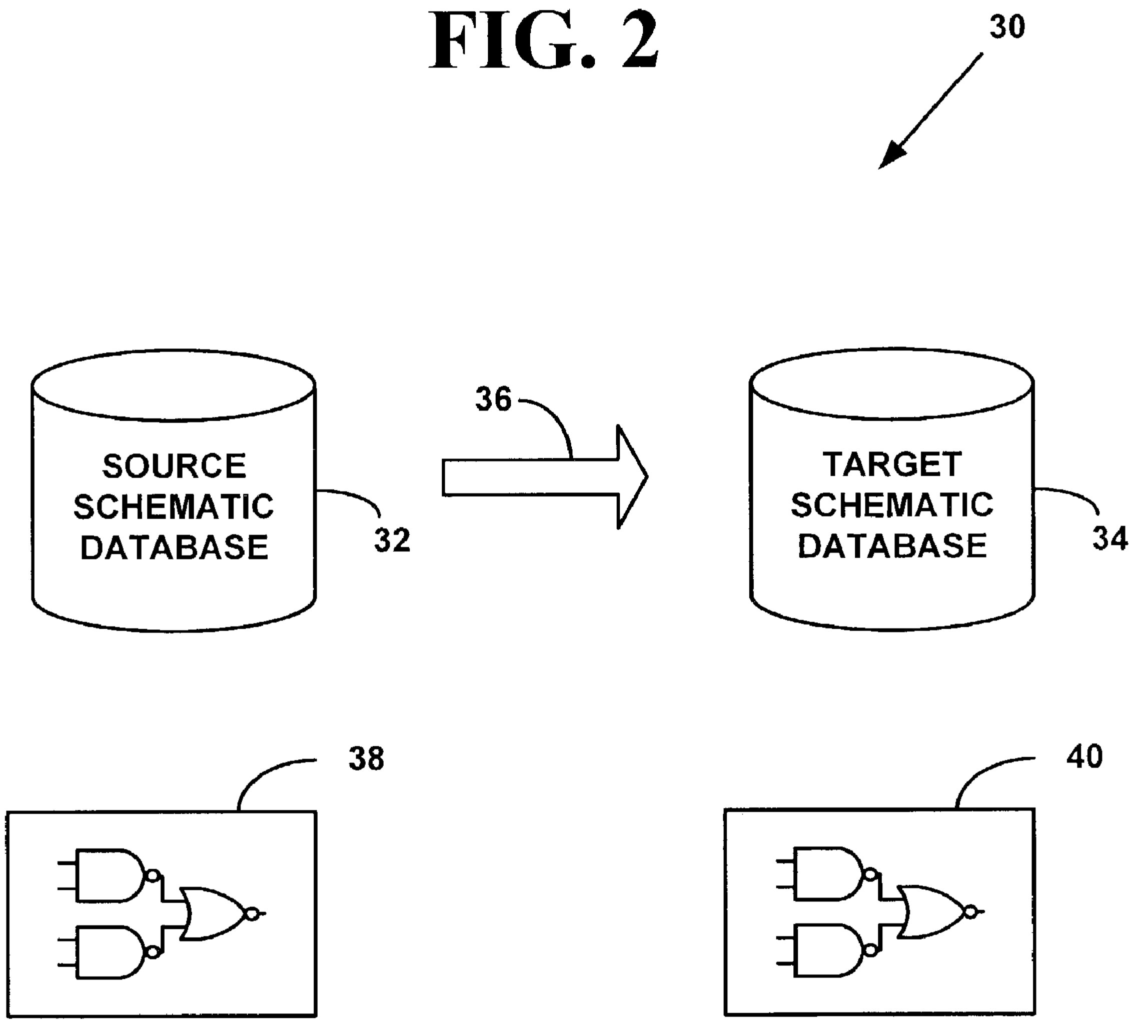
FIG. 2 is a block diagram illustrating a schematic migration from a source schematic database to a target schematic database in the computer-aided integrated circuit design system of FIG. 1.

FIG. 2 is a block diagram illustrating a schematic migration 30 from a source schematic database 32 to a target schematic database 34 in the computer-aided integrated circuit design system 10 of FIG. 1. The schematic databases 32, 34 include representations of electronic circuit blocks that are built out of circuit primitives. A circuit primitive represents a component of an electronic design with which the designer constructs a schematic 38, 40. Examples of circuit primitives include transistors, inverters, NAND logic gates, NOR logic gates, and flip-flops. Circuit primitives are stored in respective circuit primitive libraries in the schematic databases 32, 34. An entry for a circuit primitive in a circuit primitive library is stored as a data structure in the computer readable medium that hosts the schematic database 32, 34.

As is known to those of ordinary skill in the circuit design art, a designer may design an analog circuit according to a schematic comprising transistors, discrete components, operational amplifiers and other analog circuit primitives. Also the designer may design a digital circuit according to a schematic comprising logic gates. In the latter case, the circuit primitives are the basic logic gates. But there are a variety of transistor designs for, say, a NAND logic gate. Moreover, the NAND logic gate may be buffered to provide a better output signal when operating in conjunction with additional circuitry. The designer may thus select amongst a variety of circuit primitives that provide the common NAND logic function.

Also, the designer may design a specialized circuit that performs the NAND logic function from scratch as a circuit comprising the transistor circuit primitives. The designer may store the specialized circuit in its transistorized form in the schematic database 32, 34. Alternatively, the designer may define the specialized circuit to be a new circuit primitive for a NAND logic gate.

A circuit primitive data structure may include a graphical symbol for the schematic, parameters that describe the function of the circuit primitive to the CAD system 10, parameters that describe the geometric structure of the respective electronic component on the integrated circuit substrate, and parameters describing the electrical characteristics of the electronic circuit block or electronic component to the CAD system 10 for purposes of simulating the electrical behavior of the schematic. It should be understood that these parameters are for illustration only and do not limit the circuit primitive data structures and the schematic databases 32, 34 of CAD systems 10 to the parameters described above. For example, some CAD systems 10 permit the designer to create and associate additional parameters with the circuit primitive, which parameters are stored in the schematic database 32, 34 as part of an amended circuit primitive data structure.

In the source schematic database 32, a source schematic 38 includes source circuit primitives that are associated with the source schematic database 32, and interconnections among the source circuit primitives. In a preferred embodiment, the source schematic 38 is stored in the source schematic database 32 as separately identified entries for the source circuit primitives or electronic circuit blocks with identifiers for the terminals of each source circuit primitive or electronic circuit block. The source schematic database 32 also includes a list of which terminals are interconnected. For example, the source circuit primitives or electronic circuit blocks may be stored as nodes in a root-and-tree database structure, as is familiar to those of ordinary skill in the art, and the interconnections may be stored as links between the nodes.

The schematic migration process 36 converts the source schematic 38 comprising source circuit primitives into the target schematic 40 comprising target circuit primitives. For example, in the Cadence CAD system, the schematic migration process 36 is performed by a utility program that is written in the SKILL computer language developed by Cadence Design Systems, Inc. of San Jose, Calif. In the schematic migration process 36, the CAD system 10 attempts to associate every source circuit primitive with a corresponding target circuit primitive. The CAD system 10 also attempts to associate terminals for the target circuit primitive with respective terminals for the corresponding source circuit primitive. The CAD system 10 constructs the target schematic 40 by retaining the selection of circuit primitives and interconnections used in the source schematic 38 but substituting the target circuit primitives and terminals for the respective source circuit primitives and terminals. The CAD system 10 stores the constructed target schematic 40 in the target schematic database 34.

Associating Circuit Primitives

Figure 3:
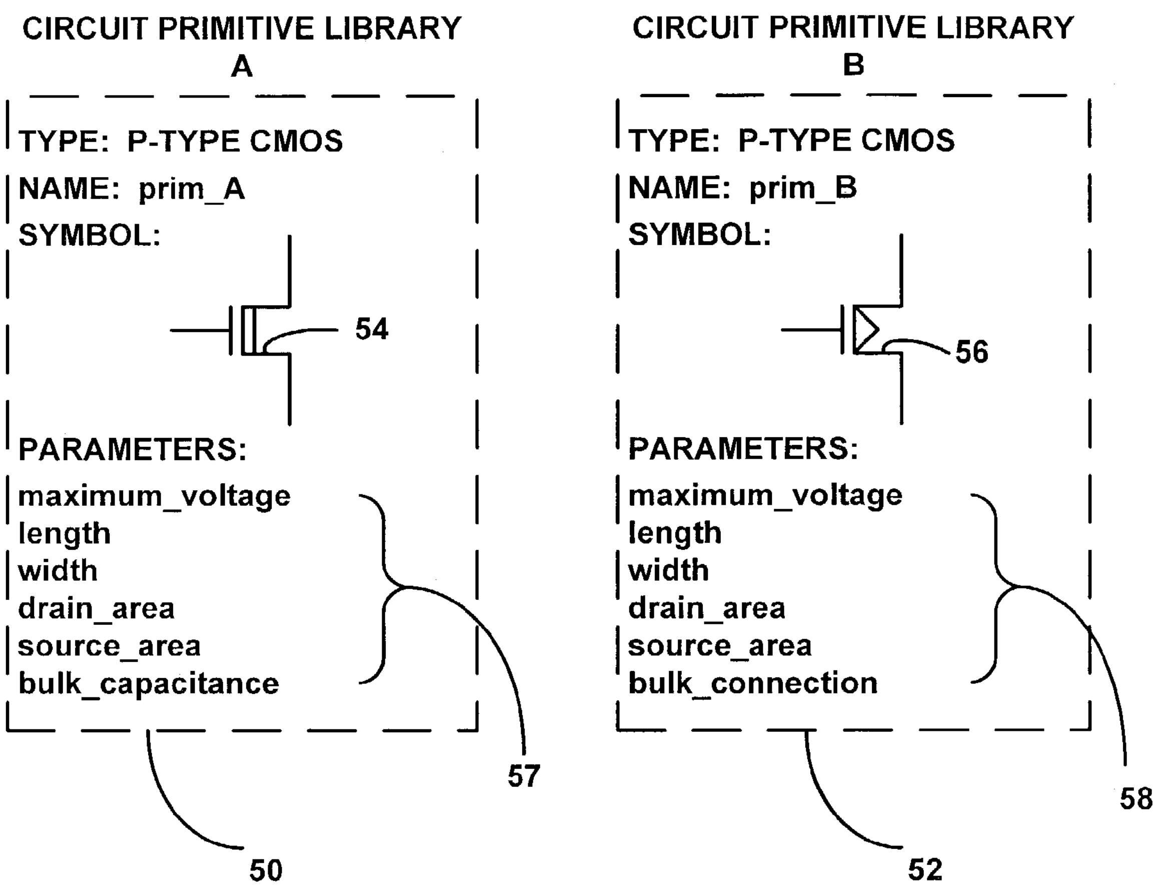
FIG. 3 is a block diagram illustrating an exemplary source circuit primitive and an exemplary target circuit primitive in the computer-aided integrated circuit design system of FIG. 1.

A step of the schematic migration process 36 is associating a target circuit primitive with a source circuit primitive. FIG. 3 is a block diagram illustrating an exemplary source circuit primitive 50 and an exemplary target circuit primitive 52 in the computer-aided integrated circuit design system 10 of FIG. 1. The source circuit primitive 50 may be stored as a data structure in the source circuit primitive library, which is part of the source schematic database 32. The target circuit primitive 52 may be stored as a data structure in the target circuit primitive library, which is part of the target schematic database 34. Each data structure comprises binary information for objects that are grouped together, the grouping represented here by the dotted lines of the circuit primitives 50, 52. Each data structure may group objects of varying types, such as a binary representation of a graphical symbol, numerical data, and text strings, or pointers to these objects.

The source schematic database 32 may be from an external vendor that sells its proprietary schematics to the designer. Alternatively, the source schematic database 32 may be from another design team that is cooperating on designing the integrated circuit, but whose schematic database 32 is different from the target schematic database 34 used by the designer. Additionally, as manufacturing technology develops, a source schematic 38 designed originally in older technology may be the basis for the target schematic 40 in the newer technology. For example, the designer may reuse the source schematic 38 from the source schematic database for 170 nm CMOS technology as a basis for target schematics 40 for 140 nm or 110 nm target technologies. The schematic databases for 170 nm, 140 nm, and 110 nm technologies may differ in several ways. For example, circuit primitives for 110 nm transistors may be associated with more parameters compared to 140 nm or 170 nm transistors because the behavior of 110 nm transistors is more sensitive to variations in parameters for doping, structure, and component separation on the integrated circuit.

The exemplary source circuit primitive 50 is the circuit primitive for a NAND logic gate from source circuit primitive library A. The data structure for the NAND logic gate is named as "prim_A" in the source circuit primitive library A. The data structure may include a graphical symbol 54 for the NAND logic gate and parameters that describe physical and/or electrical characteristics of the electronic component source corresponding to the source circuit primitive 50. When the CAD system 10 reads an occurrence of prim_A from the source schematic 38, the CAD system 10 draws the graphical symbol 54 for the NAND logic gate on the display 18 of the workstation 12 through the GUI. Additionally, the CAD system 10 may calculate the combined physical and/or electrical characteristics of a group of circuit primitives 50 in a schematic 38. The parameters 57 in the primitive 50 are the names of computer program variables that are used to calculate the combined characteristics of a schematic 38 as a function of the values of the variables.

Similarly, the exemplary target circuit primitive 52 is the circuit primitive for a NAND logic gate from target circuit primitive library B. The data structure for the NAND logic gate is named as "prim_B" in the target circuit primitive library B. The data structure may include a graphical symbol 56 for the NAND logic gate and parameters 58 for the electronic component associated with the circuit primitive 52.

During the schematic migration process 36, the CAD system 10 associates source circuit primitives 50 with corresponding target circuit primitives 52. The association may be performed by a utility program running on the CAD system 10. The source schematic 38 is converted to the target schematic 40 by replacing the source circuit primitives 50 with the target circuit primitives 52. For example, the CAD system 10 replaces occurrences of prim_A in the source schematic 38 with prim_B from the target circuit primitive library B.

Typically, the association of a particular source circuit primitive 50 with a corresponding target circuit primitive 52 is determined by whether the source 50 and target 52 primitives include the same character string for the type of circuit primitive. Alternatively, the schematic migration utility program consults a file where the name "prim_A" of the source circuit primitive library A in the source schematic database 32 has previously been associated with the name "prim_B" of the target circuit primitive library B in the target schematic database 34. Also as an alternative, the schematic migration utility program may associate the two circuit primitives 50, 52 that have the most number of parameters 57, 58 in common. The circuit primitives 50, 52 may further be associated by the CAD system 10 due to other common properties, such as the impedances of inputs or outputs, supply voltage ranges, or switching speed.

Figure 4:
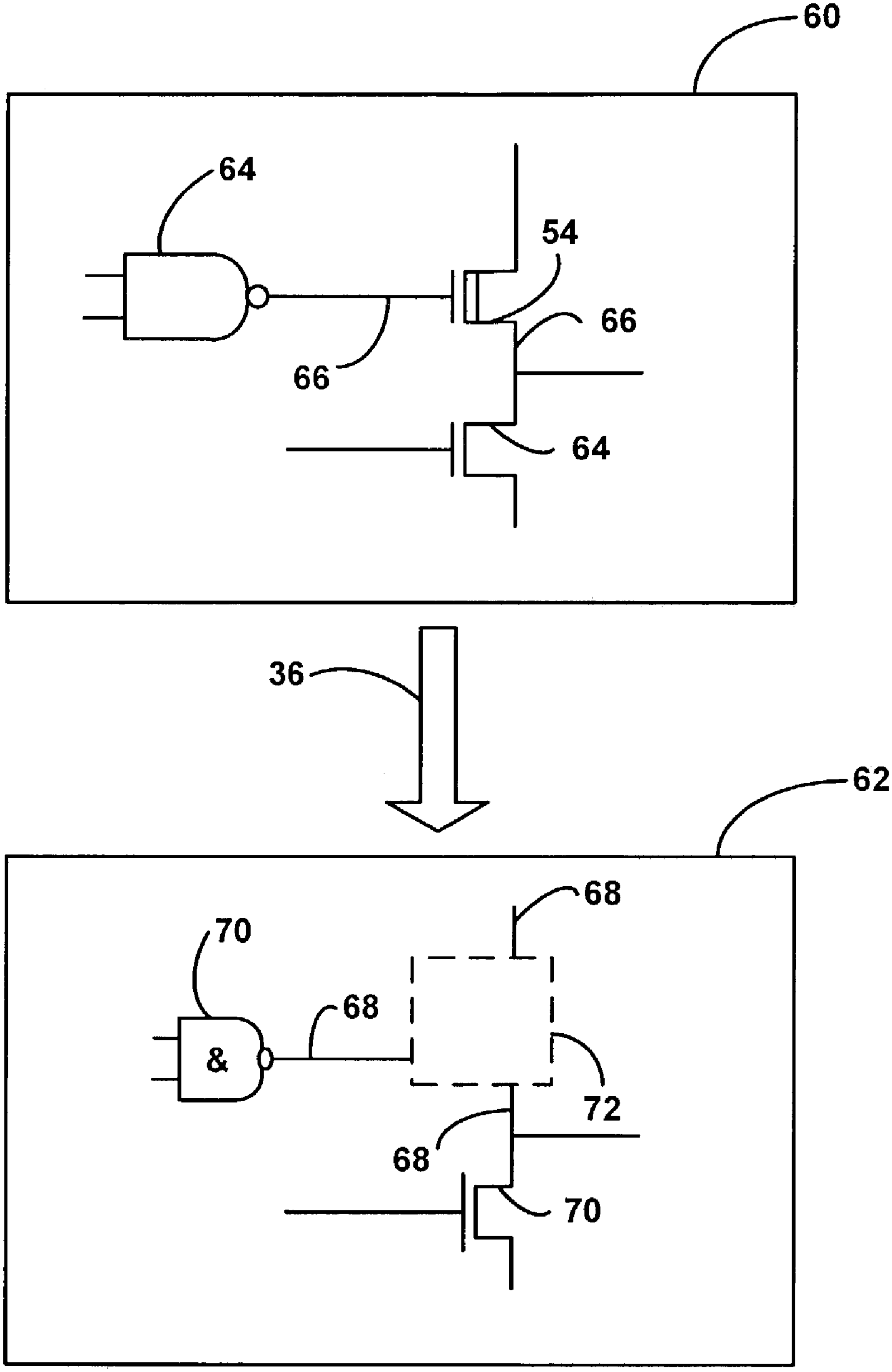
FIG. 4 is a block diagram illustrating a schematic migration process from a source schematic to a target schematic where the target graphical symbol is missing.

The source circuit primitive 50, however, may not be associated with a target circuit primitive. In other words, the target circuit primitive is missing. FIG. 4 is a block diagram illustrating a schematic migration process 36 from a source schematic 60 to a target schematic 62, wherein the target graphical symbol is missing. In the source schematic 60, the graphical symbol 54 for the source circuit primitive 50 connects to the source graphical symbols 64 for other components in the source schematic 60 through connecting lines 66. During the schematic migration process 36, the CAD system 10 replaces the source graphical symbols 64 with the corresponding target graphical symbols 70. But the target schematic 62 may not include a target graphical symbol corresponding to a source graphical symbol 54 if the source circuit primitive 50 does not correspond to a target circuit primitive 52. Consequently, as is depicted in FIG. 4, the target schematic 62 may have an empty graphical area 72 that ordinarily would be occupied by a respective target graphical symbol 52.

A consequence of the missing target graphical symbol 70 may be dangling lines 68 in the target schematic 62. Dangling lines 68 are lines that do not appear to connect to a graphical symbol for an electronic component on the graphical display screen 18 of the CAD system 10. Further, some CAD systems 10 may interpret the dangling lines 68 as an absence of an electrical connection between the components in the target schematic 62. The absence of the electrical connection may be interpreted by the CAD system 10 as due to an electrically incomplete target schematic 62, which may prompt the CAD system 10 to issue an error message associated with an invalid target schematic 62.

Figure 5:
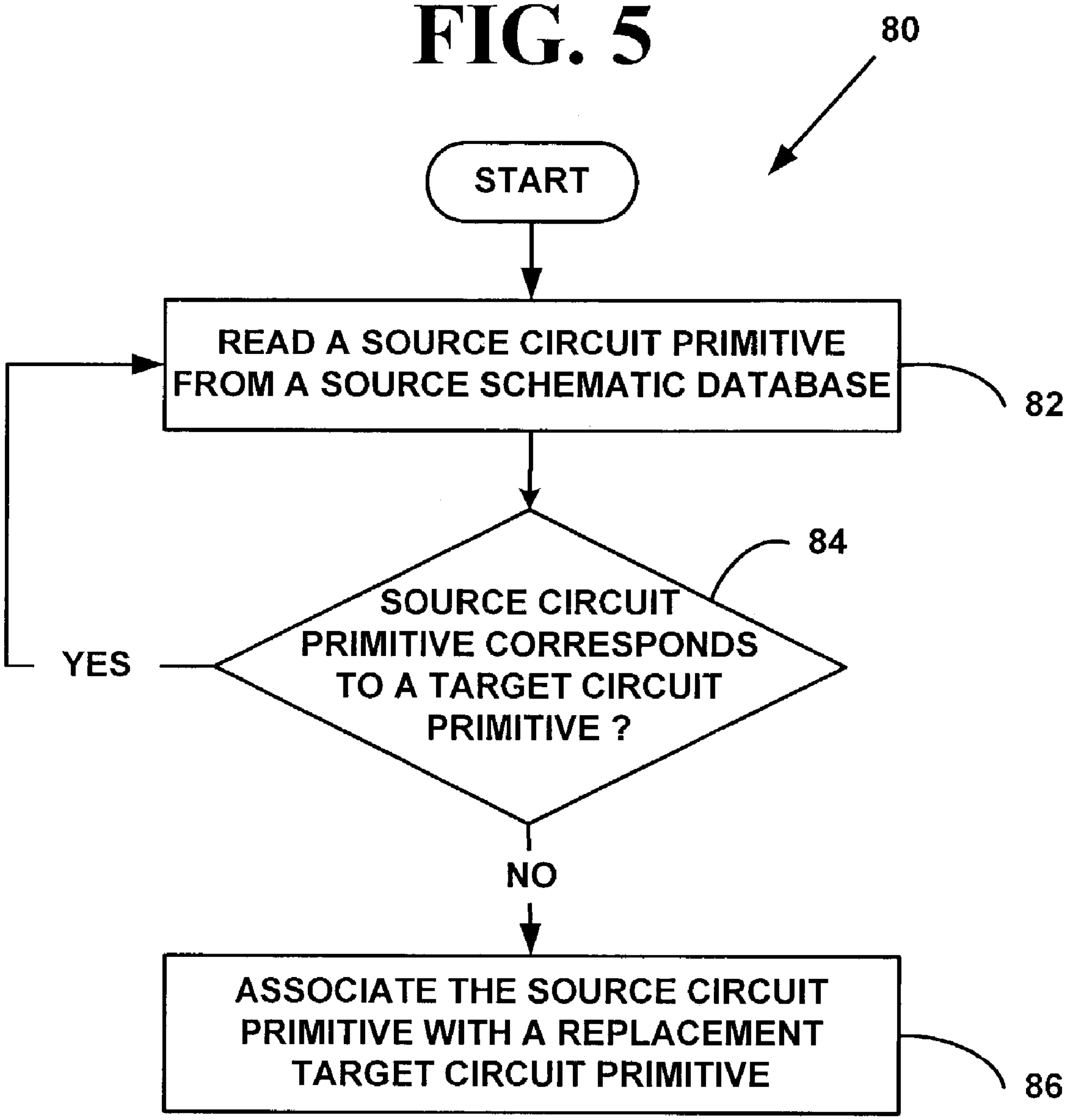
FIG. 5 is a flow diagram illustrating a preferred method of resolving missing graphical symbols in the computer-aided integrated circuit design system of FIG. 1.

FIG. 5 is a flow diagram illustrating a preferred method 80 of resolving missing graphical symbols 70 in the CAD system 10 of FIG. 1. The method 80 includes reading a source circuit primitive 50 from a source schematic database 32 at step 82. At step 84, the CAD system 10 determines whether the source circuit primitive 50 corresponds to a target circuit primitive 52 in a target schematic database 34. If the source circuit primitive 50 does not correspond to the target circuit primitive 52, the CAD system 10 associates the source circuit primitive 50 with a replacement target circuit primitive at step 86.

At step 82, the CAD system 10 reads a source circuit primitive 50 from the source schematic database 32. The CAD system 10 may search the source schematic database 32, or the source primitive library therein, for the data structure corresponding to the source circuit primitive 50. The CAD system 10 finds an address in the memory for the data structure corresponding to the source circuit primitive 50 and loads the binary information corresponding to the data structure into RAM.

At step 84, the CAD system 10 determines whether the source circuit primitive 50 corresponds to a target circuit primitive 52 in a target schematic database 34. As discussed above, the schematic migration utility program that performs the schematic migration process 36 on the CAD system 10 may consult a file that ostensibly associates source circuit primitives 50 in the source schematic database 32 with corresponding target circuit primitives 52 in the target schematic database 34. Alternatively, the CAD system 10 may compare the name of the source circuit primitive 50 to the names of target circuit primitives 52 in the target schematic database 34 in a search for an identical character string for the name of the source circuit primitive 50.

Figure 6:
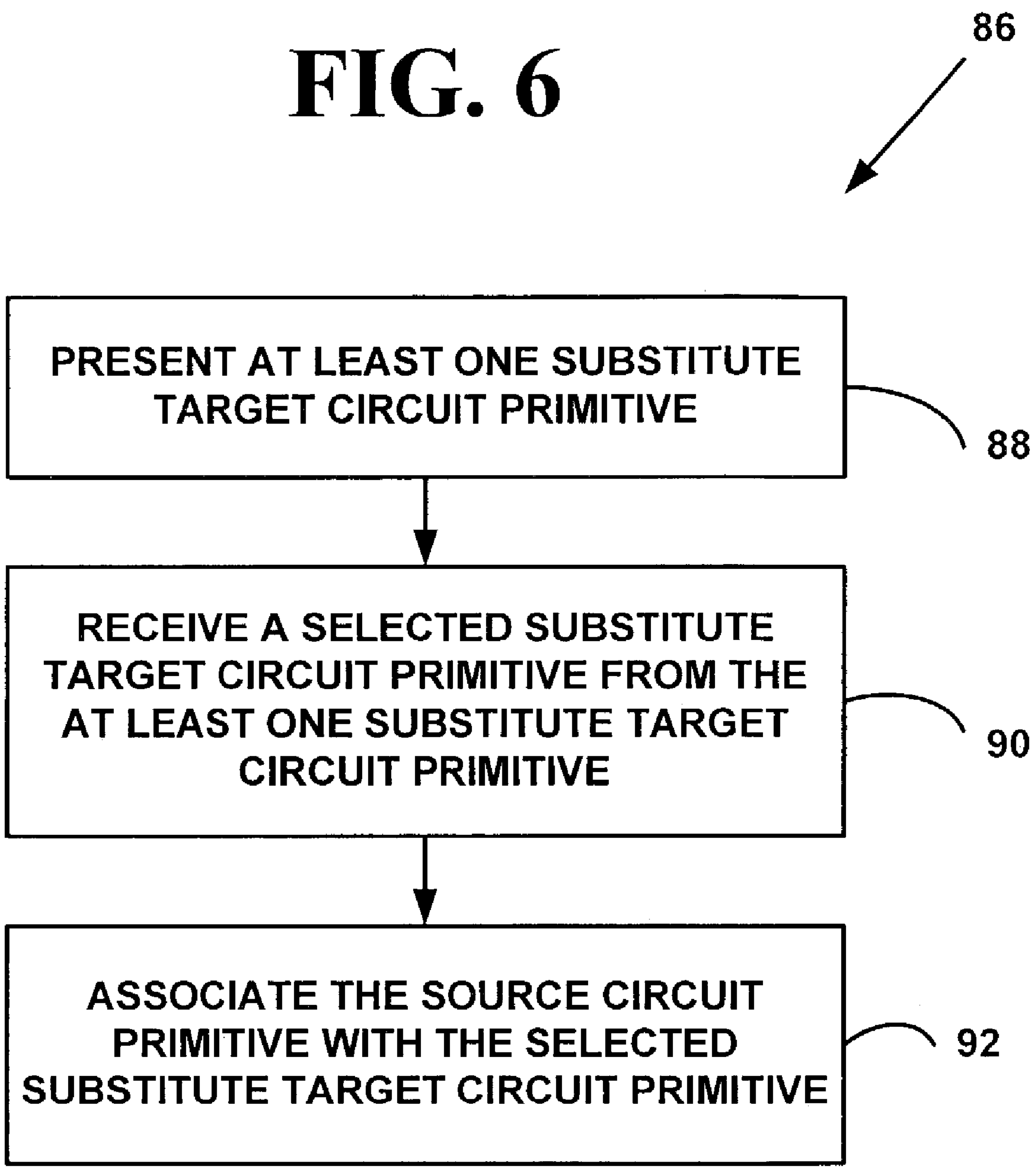
FIG. 6 is a flow diagram illustrating an embodiment of the associating step of the method of FIG. 5.
Figure 7:
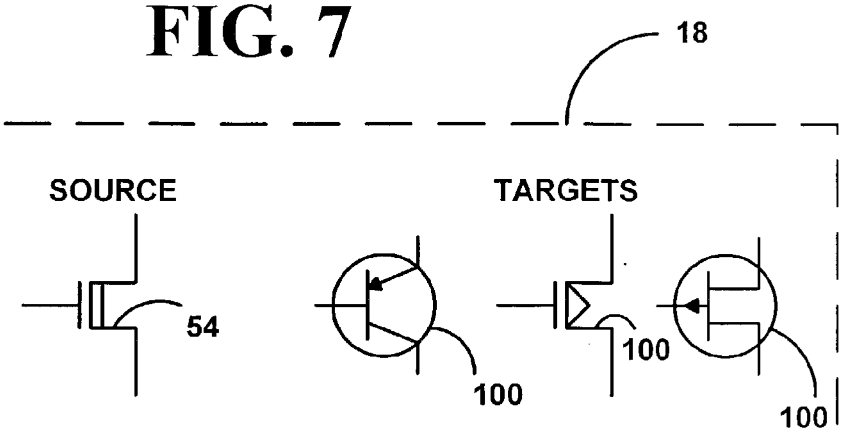
FIG. 7 is an exemplary display of at least one substitute target circuit primitive.

If there is no target circuit primitive 52 corresponding to the source circuit primitive 50, the CAD system 10 associates the source circuit primitive 50 with a replacement target circuit primitive at step 86. In one embodiment of step 86, depicted in FIG. 6, the CAD system 10 presents at least one substitute target circuit primitive to the designer on the user interface of the CAD system 10 at step 88. For example, the CAD system 10 may display the graphical symbols associated with the possible substitute target circuit primitives on the graphical display screen 18. FIG. 7 is an exemplary display of at least one substitute target circuit primitive. On the graphical display screen 18, the CAD system 10 may display the source graphical symbol 54 and the graphical symbols 100 of the possible substitute target circuit primitives. Also, the CAD system 10 may display the source parameters 57 and their values for the source circuit primitive 50 and, for comparison, the values of equivalent parameters for the possible substitute target circuit primitives.

At step 90, the CAD system 10 receives at least one substitute circuit primitive. In one embodiment, the designer uses the mouse 16 to select a substitute target circuit primitive by positioning the pointer over the selected target graphical symbol 100 and clicking. The GUI recognizes the position of the pointer and associates the position with the selected substitute target circuit primitive.

At step 92, the CAD system 10 associates the selected substitute target circuit primitive with the source circuit primitive 50. For example, the CAD system may update the file that associates source circuit primitives 50 in the source schematic database 32 with corresponding target circuit primitives 52 in the target schematic database 34. Also, the CAD system 10 inserts the graphical symbol 100 of the substitute target circuit primitive in the target schematic 62, filling the empty graphical area 72 and connecting to the other target graphical symbols 70 in the target schematic 62.

Figure 8:
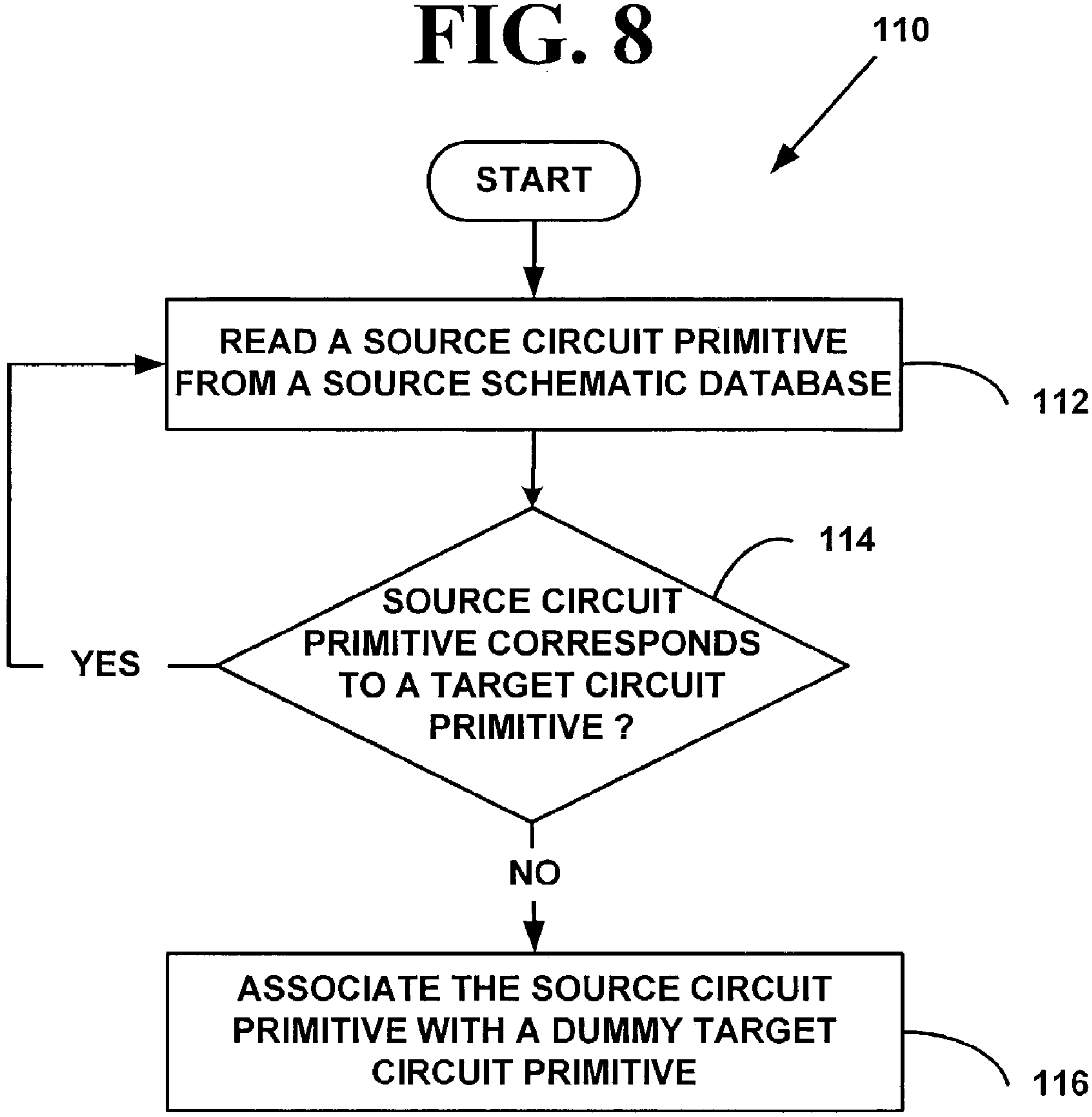
FIG. 8 is a flow diagram illustrating another preferred method of resolving missing graphical symbols in the computer-aided integrated circuit design system of FIG. 1.

In another embodiment of step 86, the CAD system 10 creates a dummy target circuit primitive. FIG. 8 is a flow diagram illustrating another method 110 of resolving missing graphical symbols in a computer-aided integrated circuit design system. The method includes reading a source circuit primitive 50 from a source schematic database 32 at step 112. The source circuit primitive 50 includes a representation of a source set of terminals. At step 114, the CAD system 10 determines whether the source circuit primitive 50 corresponds to a target circuit primitive in a target schematic database 34. If the source circuit primitive 50 does not correspond to the target circuit primitive, the CAD system 10 associates the source circuit primitive 50 with a dummy target circuit primitive at step 116. The dummy target circuit primitive includes a representation of a target set of terminals corresponding to the source set of terminals and also includes a dummy graphical symbol. The target set of terminals is mutually electrically connected. Further, the dummy graphical symbol has graphical representations of the target set of terminals.

Figure 9:
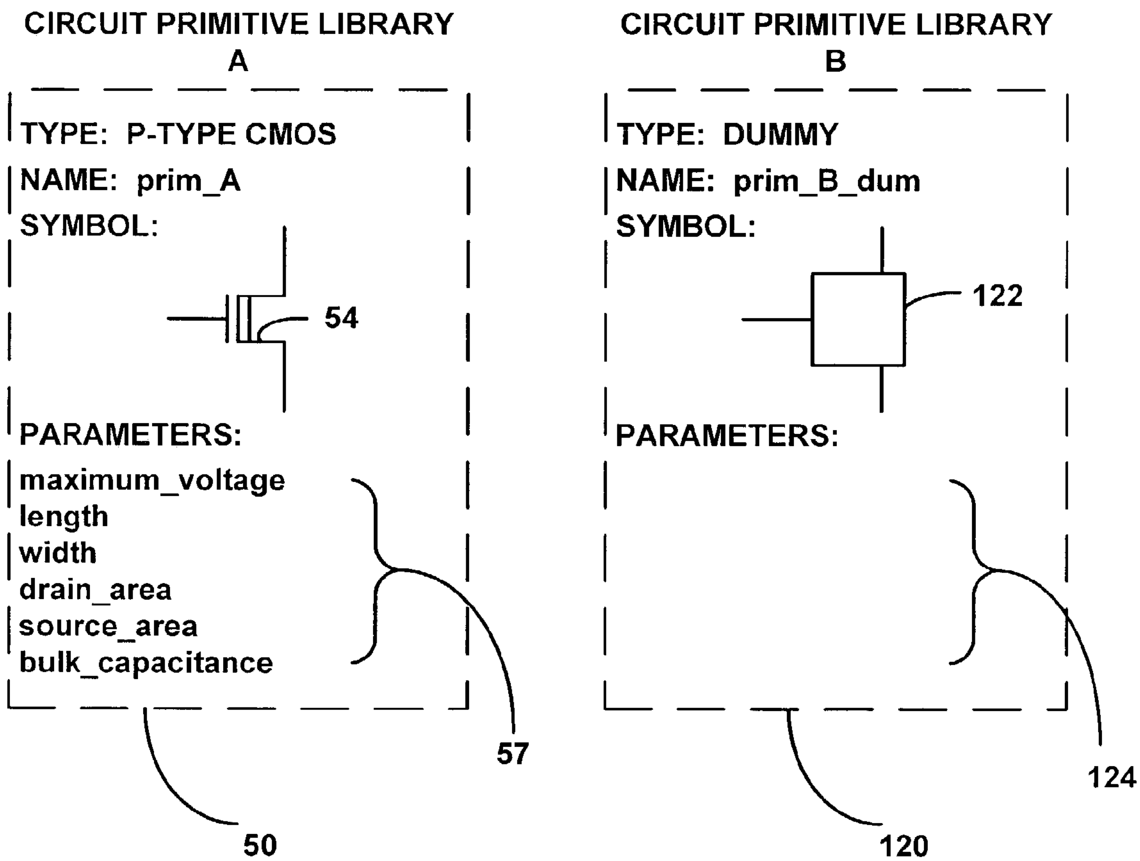
FIG. 9 is a block diagram illustrating a dummy target circuit primitive.

FIG. 9 is a block diagram illustrating a dummy target circuit primitive 120. In one preferred embodiment, the CAD system 10 creates a dummy target graphical symbol 122 having the same number of terminals as the source graphical symbol 54. In the method 110 of FIG. 8, other objects in the target circuit primitive 52 may be empty. For example, as depicted in FIG. 8, the target parameters 124 of the dummy target circuit primitive 120 may be absent. Alternatively, the target parameters 124 may be copies of the source parameters 57.

To distinguish the dummy target circuit primitive 120 from the target circuit primitive 52, the data structure corresponding to the dummy target circuit primitive 120 may be renamed. For example, to indicate to the CAD system 10 that the dummy target circuit primitive 120 includes a dummy target graphical symbol 122, the dummy target circuit primitive 120 may be named "prim_B_dum" to signify that the dummy target circuit primitive 120 is a member of circuit primitive library B. Now during the schematic migration process 36, the CAD system 10 replaces occurrences of prim_A in the source schematic 60 with prim_B_dum from the target circuit primitive library B.

Figure 10:
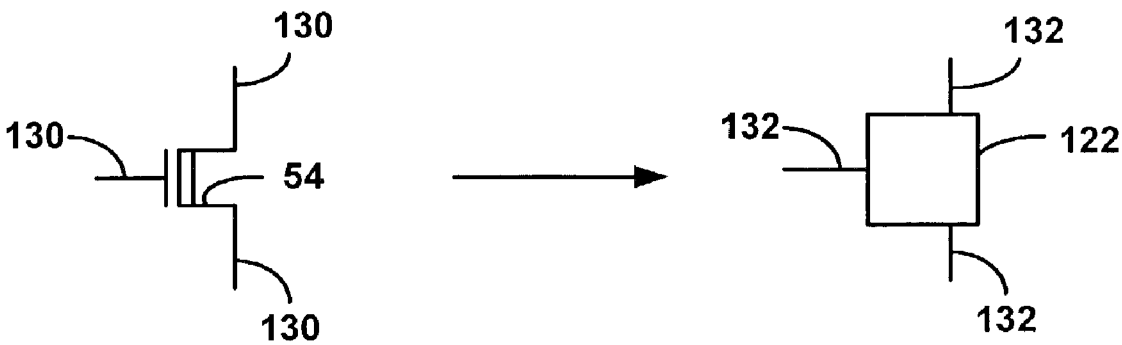
FIG. 10 is a diagram illustrating the construction of the dummy target graphical symbol of FIG. 9.

FIG. 10 is a diagram illustrating the construction of the dummy target graphical symbol 122 of FIG. 9. The CAD system 10 recognizes that the source target graphical symbol 54 has three terminals 130 and also provides the dummy target graphical symbol 122 with the same number of terminals 132. When creating the data structure corresponding to the dummy target circuit primitive 120, the CAD system 10 introduces objects that represent the terminals 132. The CAD system 10 connects the terminals 132 of the dummy target graphical symbol 122 to the other components 70 in the target schematic 60 of FIG. 4. In this manner, the CAD system 10 replaces the missing target graphical symbol 70 with the dummy target graphical symbol 122 and eliminates the dangling lines 68. With the inclusion of the dummy target graphical symbol 122, the CAD system 10 does not interpret the target schematic 62 as electrically incomplete.

Figure 11:
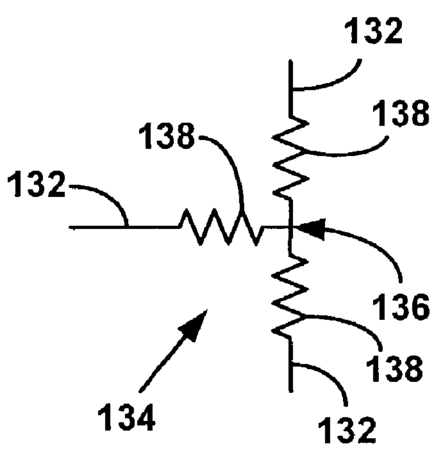
FIG. 11 is a diagram illustrating an embodiment of the dummy target graphical symbol of FIG. 10.

FIG. 11 is a diagram illustrating an embodiment 134 of the dummy target graphical symbol 122 of FIG. 10. In one embodiment, the CAD system 10 creates the dummy target circuit primitive 120 as equivalent to a resistor network 134. Each terminal 132 of the dummy target circuit primitive 120 connects to a common electrical point 136 through a resistor 138. The resistors 138 maintain the electrical connectivity between the terminals 132 and through the target schematic 62. In one embodiment, the common electrical point 136 is a ground or zero voltage for the integrated circuit. In this case, each terminal 132 is grounded through a respective resistor 138. Therefore, each of the dangling lines 68 is grounded through the resistors 138, again providing an electrically complete target schematic 62. The resistor 138 values may be set to large values, such as a mega-ohm, by the CAD system 10 because a purpose of the resistors 138 is to complete the electrical circuit of the target schematic 62 rather than perform an active role in the target schematic 62.

It should be understood, however, that the above embodiment of a p-type transistor is for illustrative purposes only and that the invention includes all types of other components. Further, the form of the data structure for the source 50 and dummy target 120 circuit primitives are also for illustrative purposes only and that many more forms and arrangements of the circuit primitives 50, 120 are possible.

During the process of schematic migration, the method 80 of resolving missing graphical symbols recognizes the source circuit primitive 50 does not correspond to a target circuit primitive 52 and associates the source circuit primitive 50 with a substitute 100 or dummy 120 target circuit primitive. In a preferred embodiment, the CAD system 10 creates a log file of actions taken during the method 80 of resolving missing graphical symbols during the schematic migration process 36. For example, the CAD system 10 may create an ASCII file when the schematic migration utility is loaded into RAM and run on the CPU of the workstation 12. As the CAD system 10 identifies each source circuit primitive 50 in the source schematic database 32, the CAD system 10 performs the resolution method 80 described above. If the CAD system 10 detects missing graphical symbols at step 84, the CAD system 10 writes the name of the source circuit primitive 50 as a character string to the log file. The CAD system 10 may also write the names, if any, of the object corresponding to the source graphical symbol 54 to the log file. Further, if the CAD system 10 associates the source graphical symbol 54 with the substitute 100 or dummy 122 target graphical symbol, the CAD system 10 may also write name of the substitute 100 or dummy 120 target circuit primitive to the log file or a description of the action taken: associating to the substitute 100 or the dummy 120 target circuit primitive.

The foregoing detailed description is merely illustrative of several embodiments of the invention. Variations of the described embodiments may be encompassed within the purview of the claims. The steps of the flow diagrams may be taken in sequences other than those described, and more or fewer elements or components may be used in the block diagrams. Accordingly, any description of the embodiments in the specification should be used for general guidance, rather than to unduly restrict any broader descriptions of the elements in the following claims.

We claim:

1. A method of resolving missing graphical symbols in a computer aided integrated circuit design system, the method comprising:

(a) reading a source circuit primitive from a source schematic database;

(b) determining whether the source circuit primitive corresponds to a target circuit primitive in a target schematic database;

(c) associating the source circuit primitive with a dummy target circuit primitive if the source circuit primitive does not correspond to the target circuit primitive, wherein the replacement target circuit primitive includes the dummy target circuit primitive and includes a representation of a target set of terminals and a dummy graphical symbol, wherein the source circuit primitive includes a representation of a source set of terminals, wherein the target set of terminals is mutually electrically connected and corresponds to the source set of terminals, and wherein the dummy graphical symbol has graphical representations of the target set of terminals.

2. The method of claim 1 further comprising:

(d) replacing an entry for the source circuit primitive in a source schematic with the replacement target circuit primitive.

3. The method of claim 1 wherein (c) comprises:

(c1) presenting at least one substitute target circuit primitive on a user interface of the computer-aided integrated circuit design system if the source circuit primitive does not correspond to the target circuit primitive;

(c2) receiving a selected substitute target circuit primitive from the at least one substitute target circuit primitive on the user interface; and (c3) associating the source circuit primitive with the selected substitute target circuit primitive, wherein the replacement target circuit primitive is the selected substitute target circuit primitive.

4. The method of claim 1 wherein (c) further comprises: creating the dummy target circuit primitive as a representation of a resistor network, wherein the resistor network mutually connects the target set of terminals.

5. The method of claim 4 wherein (c) further comprises: creating the resistor network by connecting each terminal of the target set of terminals to a common electrical point through a respective resistor.

6. The method of claim 5 wherein the common electrical point comprises a ground.

7. The method of claim 1 further comprising:

creating a log file of actions performed during steps (a), (b), and (c).

8. A computer readable medium, having stored therein instructions for causing processing unit to execute the steps of:

(a) reading a source circuit primitive from a source schematic database;

(b) determining whether the source circuit primitive corresponds to a target circuit primitive in a target schematic database;

(c) associating the source circuit primitive with a dummy target circuit primitive if the source circuit primitive does not correspond to the target circuit primitive, wherein the replacement target circuit primitive includes the dummy target circuit primitive and includes a representation of a target set of terminals and a dummy graphical symbol, wherein the source circuit primitive includes a representation of a source set of terminals, wherein the target set of terminals is mutually electrically connected and corresponds to the source set of terminals, and wherein the dummy graphical symbol has graphical representations of the target set of terminals.

9. A system for resolving missing graphical symbols in a computer aided integrated circuit design system, the system comprising:

(a) means for reading a source circuit primitive from a source schematic database;

(b) means for determining whether the source circuit primitive corresponds to a target circuit primitive in a target schematic database;

(c) means for associating the source circuit primitive with a dummy target circuit primitive if the source circuit primitive does not correspond to the target circuit primitive wherein the replacement target circuit primitive includes the dummy target circuit primitive and includes a representation of a target set of terminals and a dummy graphical symbol, wherein the source circuit primitive includes a representation of a source set of terminals, wherein the target set of terminals is mutually electrically connected and corresponds to the source set of terminals, and wherein the dummy graphical symbol has graphical representations of the target set of terminals.

10. The system of claim 9 further comprising:

(d) means for replacing an entry for the source circuit primitive in a source schematic with the replacement target circuit primitive.

11. The system of claim 9 wherein (c) comprises:

(c1) means for presenting at least one substitute target circuit primitive on a user interface of the computer-aided integrated circuit design system if the source circuit primitive does not correspond to the target circuit primitive;

(c2) means for receiving a selected substitute target circuit primitive from the at least one substitute target circuit primitive on the user interface; and (c3) means for associating the source circuit primitive with the selected substitute target circuit primitive, wherein the replacement target circuit primitive is the selected substitute target circuit primitive.

12. The system of claim 9 wherein the dummy target circuit primitive is a representation of a resistor network, wherein the resistor network mutually connects the target set of terminals.

13. The system of claim 12 wherein the resistor network connects each terminal of the target set of terminals to a common electrical point through a respective resistor.

14. The system of claim 13 wherein the common electrical point comprises a ground.

15. A method of resolving source circuit primitives, the method comprising:

(a) reading a source circuit primitive from a predetermined source schematic database having a plurality of source circuit primitives;

(b) determining whether the source circuit primitive corresponds to a target circuit primitive in a a predetermined target circuit database having a plurality of target circuit primitives; and (c) associating the source circuit primitive read from the predetermined source schematic database with a replacement target circuit primitive of the predetermined target circuit database if the source circuit primitive does not correspond to the target circuit primitive, wherein the source circuit primitives from the predetermined source schematic database do not have a corresponding target circuit primitive from the predetermined target circuit database, and wherein the predetermined source schematic database comprises source circuit primitive of a first proprietary circuit technology, and the predetermined target circuit database comprises target schematic primitives of a second proprietary technology.

16. A method of converting a source schematic having source circuit primitives stored in a predetermined source schematic database into a target schematic comprising target circuit primitives stored in a predetermined target circuit database, the source schematic database having a plurality of source circuit primitives, and the target circuit database having a plurality of target circuit primitives, the method comprising:

(a) reading a source circuit primitive of the source circuit schematic from the source schematic database;

(b) determining, whether the read source circuit primitive of the source schematic has a corresponding target circuit primitive in the target schematic database;

(c) replacing the source circuit primitive with the corresponding target circuit primitive in the source schematic if the source circuit primitive of the source schematic includes a corresponding target circuit primitive; and (d) replacing the source circuit primitive with a replacement target circuit primitive included in the target schematic database, if the source circuit primitive of the source schematic does not have a corresponding target circuit primitive, to obtain the target schematic by processing the source circuit primitives of the source schematic, wherein, after processing of the source circuit primitives, the target schematic only includes target circuit primitives included in the target circuit database.

17. The method of claim 16, wherein the predetermined source schematic database comprises source circuit primitives of a first proprietary circuit technology and the target schematic database comprises target schematic primitives of a second proprietary technology.

18. A system for converting a source schematic having source circuit primitives stored in a predetermined source schematic database into a target schematic comprising target circuit primitives stored in a predetermined target circuit database, the source schematic database having a plurality of source circuit primitives, and the target circuit database having a plurality of target circuit primitives, the method comprising:

(a) means for reading a source circuit primitive of the source circuit schematic from the source schematic database;

(b) means for determining whether the read source circuit primitive of the source schematic has a corresponding target circuit primitive in the target schematic database;

(c) means for replacing the source circuit primitive with the corresponding target circuit primitive in the source schematic if the source circuit primitive of the source schematic includes a corresponding target circuit primitive; and (d) means for replacing the source circuit primitive with a replacement target circuit primitive included in the target schematic database, if the source circuit primitive of the source schematic does not have a corresponding target circuit primitive, to obtain the target schematic by processing the source circuit primitives of the source schematic, wherein, after processing of the source circuit primitives, the target schematic only includes target circuit primitives included in the target circuit database.

19. A computer readable medium, having stored therein instructions for converting a source schematic having source circuit primitives stored in a predetermined source schematic database, the source schematic database having a plurality of source circuit primitives into a target schematic comprising target circuit primitives stored in a predetermined target circuit database, the target circuit database having a plurality of target circuit primitives, the instruction causing a processing unit to execute the steps of (a) reading a source circuit primitive of the source circuit schematic from the source schematic database;

(b) determining, whether the read source circuit primitive of the source schematic has a corresponding target circuit primitive in the target schematic database;

(c) replacing the source circuit primitive with the corresponding target circuit primitive in the source schematic if the source circuit primitive of the source schematic includes a corresponding target circuit primitive; and (d) replacing the source circuit primitive with a replacement target circuit primitive included in the target schematic database, if the source circuit primitive of the source schematic does not have a corresponding target circuit primitive, to obtain the target schematic by processing the source circuit primitives of the source schematic, wherein, after processing of the source circuit primitives, the target schematic only includes target circuit primitives included in the target circuit database.

* * * * *